(12) United States Patent
Hwang et al.

(10) Patent No.: US 8,771,592 B2
(45) Date of Patent: Jul. 8, 2014

(54) LEAD-FREE SOLDER COMPOSITION

(75) Inventors: Jennie S. Hwang, Moreland Hills, OH (US); John Pereira, Rehoboth, MA (US); Alexandra Mary Mackin, West Warwick, RI (US); Joseph C. Gonsalves, North Attleborough, MA (US)

(73) Assignee: Antaya Technologies Corp., Cranston, RI (US)

( * ) Notice: Subject to any disclaimer, the term of this patent is extended or adjusted under 35 U.S.C. 154(b) by 0 days.

(21) Appl. No.: 13/363,618

(22) Filed: Feb. 1, 2012

(65) Prior Publication Data
US 2012/0222893 A1 Sep. 6, 2012

Related U.S. Application Data

(60) Provisional application No. 61/439,538, filed on Feb. 4, 2011, provisional application No. 61/540,213, filed on Sep. 28, 2011.

(51) Int. Cl.
*C22C 28/00* (2006.01)
*B23K 35/26* (2006.01)

(52) U.S. Cl.
USPC ........................................ 420/555

(58) Field of Classification Search
USPC ........................................ 420/555
See application file for complete search history.

(56) References Cited

U.S. PATENT DOCUMENTS

| 5,120,498 | A | 6/1992 | Cocks |
| 6,179,935 | B1 | 1/2001 | Yamashita et al. |
| 6,180,055 | B1 * | 1/2001 | Tetsuro .......................... 420/560 |
| 6,253,988 | B1 | 7/2001 | Pereira |
| 6,367,683 | B1 | 4/2002 | Rass et al. |
| 6,841,845 | B2 * | 1/2005 | Iwamoto et al. .............. 257/529 |
| 7,261,760 | B2 * | 8/2007 | Ishida et al. .................... 75/255 |
| 7,749,336 | B2 | 7/2010 | Huang et al. |
| 7,806,994 | B2 | 10/2010 | Smith et al. |
| 2005/0031483 | A1 | 2/2005 | Liu et al. |
| 2007/0036670 | A1 | 2/2007 | Pereira |
| 2007/0256761 | A1 | 11/2007 | Hwang et al. |
| 2008/0175748 | A1 | 7/2008 | Pereira |

FOREIGN PATENT DOCUMENTS

| EP | 0976489 A * | 2/2000 |
| JP | 2-217193 | 8/1990 |
| JP | 2001-214985 | 8/2001 |
| JP | 2003-13165 | 1/2003 |

OTHER PUBLICATIONS

Okamoto, H., In (Indium) Binary Alloy Phase Diagrams, Alloy Phase Diagrams, vol. 3, ASM Handbook, ASM International, 1992, p. 2.252-2.264.*

(Continued)

*Primary Examiner* — Sikyin Ip
(74) *Attorney, Agent, or Firm* — Hamilton, Brook, Smith & Reynolds, P.C.

(57) ABSTRACT

A solder composition includes about 4% to about 25% by weight tin, about 0.1% to about 8% by weight antimony, about 0.03% to about 4% by weight copper, about 0.03% to about 4% by weight nickel, about 66% to about 90% by weight indium, and about 0.5% to about 9% by weight silver. The composition can further include about 0.2% to about 6% by weight zinc, and, independently, about 0.01% to about 0.3% by weight germanium. The composition can be used to solder an electrical connector to an electrical contact surface on a glass component.

18 Claims, 10 Drawing Sheets

(56) References Cited

OTHER PUBLICATIONS

Amagai, M., et al., "High Drop Test Reliability: Lead-free Solders," *2004 Electronic Components and Technology Conference*, pp. 1304-1309.

Chen, C., et al., "Wetting Interactions Between the Ni-Cu-P Deposit and In-Sn Solders," IEEE Transactions on Components, Packaging and Manufacturing Technology—Part B, 20(3): 211-216 (Aug. 1997).

Gnecco, F., et al., "Wetting behaviour and reactivity of lead free Au-In-Sn and Bi-In-Sn alloys on copper substrates," *Intl. J. of Adhesion & Adhesives*, 27: 409-416 (2007).

Indium Corporation of America, Product Data Sheet, Solder Wire (2 pages) [online—retrieved Aug. 16, 2012]. Retrieved from the Internet URL: http://www.indium.com/products.

International Search Report and Written Opinion, PCT/US2012/023492, date of mailing May 4, 2012.

Lin, K., et al., "The Effect of Flux on the Wetting of Autocatalytic Ni-Cu-P by In-Sn Solder," *The Intl. J. of Microcircuits and Electronic Packaging*, 22(2), Second Quarter: 115-120 (1999).

Liu, X., et al., "A study on the reliability of indium solder die bonding of high power semiconductor lasers," *J. of Applied Physics*, 100: 013104-1-013104-11 (2006).

Scbo, P., et al., "Effect of indium on the microstructure of the interface between Sn3.13Ag0.74CuIn solder and Cu substrate," *J. of Alloys and Compounds*, 480: 409-415 (2009).

Shimizu, K., et al., "Solder Joint Reliability of Indium—Alloy Interconnection," *J. of Electronic Materials*, 24(1): 39-45 (1995).

Hwang, J.S., "Environment-Friendly Electronics: Lead-Free Technology," (Electrochemical Publications Ltd., British Isles), pp. 266-293, 301-406 (2001), ISBN 0 901150 40 1.

Notification Concerning Transmittal of International Preliminary Report on Patentability for Int'l Application No. PCT/US2012/023492; entitled: "Lead-Free Solder Composition," Date Mailed: Aug. 15, 2013.

\* cited by examiner

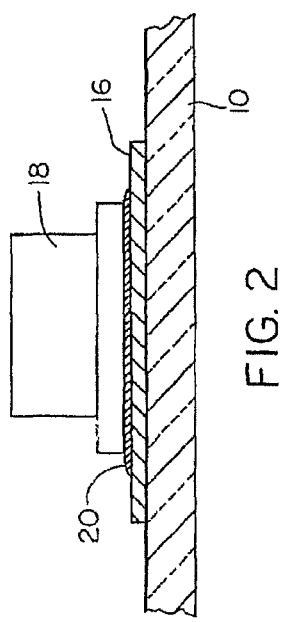

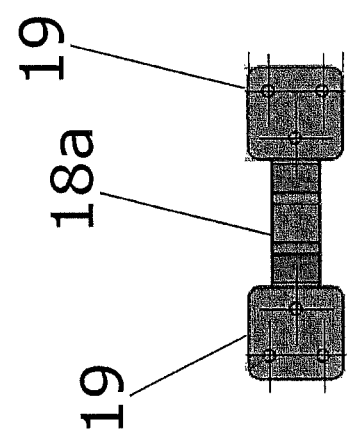
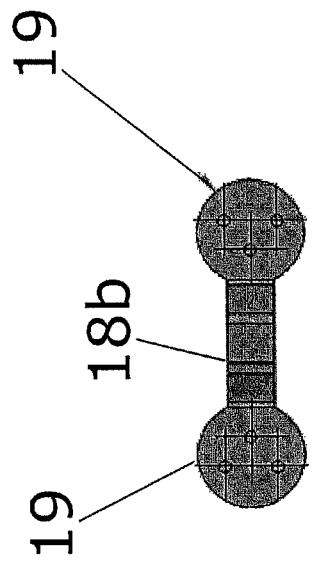
FIG. 4A
FIG. 4B

LEAD-FREE SOLDER COMPOSITION

RELATED APPLICATIONS

This application claims the benefit of U.S. Provisional Application No. 61/439,538, filed on Feb. 4, 2011 and U.S. Provisional Application No. 61/540,213, filed on Sep. 28, 2011. The entire teachings of the above applications are incorporated herein by reference.

BACKGROUND OF THE INVENTION

Windshields and rear windows of vehicles such as automobiles often include electrical devices located within or on the glass. Typically, the electrical devices are antennas or defrosters. In order to provide an electrical connection to such an electrical device, a small area of metallic coating is applied to the glass to make the metalized surface which is electrically connected to the electrical device. An electrical connector is then soldered onto the metalized surface. The electrical (i.e., power) connector is commonly soldered to the metalized surface of glass with a solder that contains lead (Pb). Due to environmental concerns and/or regulatory mandates in various countries, most industries are currently using or planning to use non-lead solders in soldering applications. A common non-lead solder employed in some industries contains a high tin (Sn) content, such as more than 80% tin. Non-lead solders used on automotive glass as described herein are disclosed in U.S. Pat. No. 6,253,988 issued to John Pereira on Jul. 3, 2001 (hereinafter "Pereira"). Among several non-lead solders, Pereira discloses a solder composition with a weight percentage of 64.35%-65.65% indium (In), 29.7%-30.3% tin (Sn), 4.05%-4.95% silver (Ag), 0.25%-0.75% copper (Cu) (hereinafter the "65 Indium Solder").

There are difficulties encountered when soldering devices to automotive glass that are not present in other applications. Automotive glass tends to be brittle, and the common high tin, non-lead solders that are suitable for use in other applications can typically cause cracking of the automotive glass. Although materials such as ceramics and silicon might appear to be similar in some respects to automotive glass, some solders that are suitable for soldering to ceramic or silicon devices are not suitable for soldering to automotive glass. Soldering two materials with a substantial difference in coefficient of thermal expansion (CTE) between them, such as glass and copper in this case, imposes stress on the solder, either during cooling of the solder joint, or during subsequent temperature excursions. The solder composition needs to have a melting point (liquidus) that is low enough to not cause cracking of the automotive glass during the soldering process, because a higher melting point and correspondingly higher processing temperature augments the adverse effects of CTE mismatch, imposing higher stress during cooling. The melting point of the solder composition, however, needs to be high enough not to melt during the normal use of a car, for example, when the car is in the sun with the windows closed or under other extreme harsh environmental conditions. Solders that contain indium, however, normally have much lower melting points than other solders. The 65 Indium Solder, for example, has a solidus temperature of 109° C., compared to 160° C. of the lead solder, and a liquidus temperature of 127° C., compared to 224° C. of the lead solder. Some vehicle manufacturers desire that glass products should be capable of surviving elevated temperatures, for example 110° C. for one original equipment manufacturer (OEM) and 120° C. for another, without any deterioration in performance.

Therefore, there is a need for a non-lead solder composition suitable for use on glass that can withstand higher elevated temperatures than compositions currently available, while delivering all other desired properties for this application sector.

SUMMARY OF THE INVENTION

The invention generally is directed to a solder composition. One embodiment includes about 4% to about 25% by weight tin, about 0.1% to about 8% by weight antimony, about 0.03% to about 4% by weight copper, about 0.03% to about 4% by weight nickel about 66% to about 90% by weight indium, and about 0.5% to about 9% by weight silver. The solder composition can have a solidus temperature in a range of between about 120° C. and about 145° C., and a liquidus temperature in a range of between 130° C. and about 155° C.

In certain embodiments, the composition further includes about 0.2% to about 6% by weight zinc. In certain other embodiments, the composition further includes about 0.01% to about 0.3% by weight germanium. In these specific embodiments, the composition can include about 70% to about 86% by weight indium.

In some embodiments, the composition includes about 7% to about 19% by weight tin, about 0.2% to about 8% by weight antimony, about 0.1% to about 1.5% by weight copper, about 0.1% to about 4% by weight nickel, about 70% to about 80% by weight indium, and about 4% to about 8% by weight silver.

In some other embodiments, the composition includes about 4% to about 20% by weight tin, about 0.1% to about 8% by weight antimony, about 0.1% to about 4% by weight copper, about 0.1% to about 3% by weight nickel about 71% to about 86% by weight indium, and about 1% to about 6% by weight silver.

In still other embodiments, the composition includes about 11% to about 17% by weight tin, about 0.5% to about 3% by weight antimony, about 0.5% to about 1.5% by weight copper, about 0.5% to about 5% by weight nickel, about 72% to about 77% by weight indium, about 4% to about 8.5% by weight silver, and about 0.3% to about 1.5% by weight zinc. In these specific embodiments, the composition can include about 13% to about 15% by weight tin, about 0.5% to about 2.5% by weight antimony, about 0.5% to about 1.5% by weight copper, about 1% to about 4% by weight nickel, about 74% to about 75% by weight indium, about 5% to about 8.5% by weight silver, and about 0.3% to about 1.5% by weight zinc. Examples of these specific embodiments can include about 15% by weight tin, about 0.5% to about 1.5% by weight antimony, about 0.5% to about 1.5% by weight copper, about 1% by weight nickel, about 75% by weight indium, about 6% by weight silver, and about 0.5% to about 1.5% by weight zinc, such as about 15% by weight tin, about 1% by weight antimony, about 1% by weight copper, about 1% by weight nickel, about 75% by weight indium, about 6% by weight silver, and about 1% by weight zinc. Other examples of these specific embodiments can include about 14% by weight tin, about 0.5% to about 1.5% by weight antimony, about 0.5% to about 1.5% by weight copper, about 3% by weight nickel, about 75% by weight indium, about 5% by weight silver, and about 0.5% to about 1.5% by weight zinc, such as about 14% by weight tin, about 1% by weight antimony, about 1% by weight copper, about 3% by weight nickel, about 75% by weight indium, about 5% by weight silver, and about 1% by weight zinc. Still other examples of these specific embodiments can include about 13% by weight tin, about 1.5% to about 2.5% by weight antimony, about 0.5% to about 1.5% by weight copper, about 4% by weight nickel, about 74% by weight indium, about 5% by weight silver, and about 0.5% to about 1.5% by weight zinc, such as about 13% by weight tin, about 2% by weight antimony, about 1% by weight copper, about 4% by weight nickel, about 74% by weight indium, about 5% by weight silver, and about 1% by weight zinc.

In yet other embodiments, the composition consists essentially of about 11% to about 17% by weight tin, about 0.5% to about 3% by weight antimony, about 0.5% to about 1.5% by weight copper, about 0.5% to about 5% by weight nickel, about 72% to about 77% by weight indium, about 4% to about 8.5% by weight silver, and about 0.3% to about 1.5% by weight zinc. In these specific embodiments, the composition can consist essentially of about 13% to about 15% by weight tin, about 0.5% to about 2.5% by weight antimony, about 0.5% to about 1.5% by weight copper, about 1% to about 4% by weight nickel, about 74% to about 75% by weight indium, about 5% to about 8.5% by weight silver, and about 0.3% to about 1.5% by weight zinc. Examples of these specific embodiments can consist essentially of about 15% by weight tin, about 0.5% to about 1.5% by weight antimony, about 0.5% to about 1.5% by weight copper, about 1% by weight nickel, about 75% by weight indium, about 6% by weight silver, and about 0.5% to about 1.5% by weight zinc, such as about 15% by weight tin, about 1% by weight antimony, about 1% by weight copper, about 1% by weight nickel, about 75% by weight indium, about 6% by weight silver, and about 1% by weight zinc. Other examples of these specific embodiments can consist essentially of about 14% by weight tin, about 0.5% to about 1.5% by weight antimony, about 0.5% to about 1.5% by weight copper, about 3% by weight nickel, about 75% by weight indium, about 5% by weight silver, and about 0.5% to about 1.5% by weight zinc, such as about 14% by weight tin, about 1% by weight antimony, about 1% by weight copper, about 3% by weight nickel, about 75% by weight indium, about 5% by weight silver, and about 1% by weight zinc. Still other examples of these specific embodiments can consist essentially of about 13% by weight tin, about 1.5% to about 2.5% by weight antimony, about 0.5% to about 1.5% by weight copper, about 4% by weight nickel, about 74% by weight indium, about 5% by weight silver, and about 0.5% to about 1.5% by weight zinc, such as about 13% by weight tin, about 2% by weight antimony, about 1% by weight copper, about 4% by weight nickel, about 74% by weight indium, about 5% by weight silver, and about 1% by weight zinc. In these specific embodiments, the solder composition can have a solidus temperature in a range of between about 120° C. and about 145° C., such as in a range of between about 120° C. and about 135° C., and a liquidus temperature in a range of between 130° C. and about 155° C., such as in a range of between about 130° C. and about 145° C.

The invention is also directed to an electrical connection on a glass component that includes a glass component, an electrical contact surface containing silver on the glass component, and an electrical connector soldered to the electrical contact surface on the glass component with a layer of a solder composition having a mixture of elements comprising about 4% to about 25% by weight tin, about 0.1% to about 8% by weight antimony, about 0.03% to about 4% by weight copper, about 0.03% to about 4% by weight nickel, about 66% to about 90% by weight indium, and about 0.5% to about 9% by weight silver. In other embodiments, an electrical connection on a glass component includes a glass component, an electrical contact surface containing silver on the glass component, and an electrical connector soldered to the electrical contact surface on the glass component with a layer of a solder composition consisting essentially of about 4% to about 25% by weight tin, about 0.1% to about 8% by weight antimony, about 0.03% to about 4% by weight copper, about 0.03% to about 4% by weight nickel, about 66% to about 90% by weight indium, and about 0.5% to about 9% by weight silver.

The invention is also directed to a method of forming the solder composition that includes mixing indium, nickel, copper, silver, antimony, and tin together to form an alloy that includes about 4% to about 25% by weight tin, about 0.1% to about 8% by weight antimony, about 0.03% to about 4% by weight copper, about 0.03% to about 4% be weight nickel, about 66% to about 90% by weight indium, and about 0.5% to about 9% by weight silver. In some embodiments, the indium and tin are mixed together in a first molten mixture, and at least nickel, copper and silver are mixed together in solution in a second mixture which is added to the first molten mixture. In other embodiments, the tin and nickel are mixed together in a molten mixture, and at least copper, indium, and silver are then added to the molten mixture. In these specific embodiments, zinc can be added after all other metals have been added to the molten mixture.

In some embodiments, tin is mixed in a proportion of about 7% to about 19% by weight, antimony is mixed in a proportion of about 0.2% to about 8% by weight, copper is mixed in a proportion of about 0.1% to about 1.5% by weight, nickel is mixed in a proportion of about 0.1% to about 4% by weight, indium is mixed in a proportion of about 70% to about 80% by weight, and silver is mixed in a proportion of about 4% to about 8% by weight.

In other embodiments, a method of forming the solder composition includes mixing indium, nickel, copper, zinc, silver, antimony, and tin together to form an alloy that includes about 11% to about 17% by weight tin, about 0.5% to about 3% by weight antimony, about 0.5% to about 1.5% by weight copper, about 0.5% to about 5% by weight nickel, about 72% to about 77% by weight indium, about 4% to about 8% by weight silver, and about 0.5% to about 1.5% by weight zinc. In these specific embodiments, the composition can include about 13% to about 15% by weight tin, about 0.5% to about 2.5% by weight antimony, about 0.5% to about 1.5% by weight copper, about 1% to about 4% by weight nickel, about 74% to about 75% by weight indium, about 5% to about 6% by weight silver, and about 0.5% to about 1.5% by weight zinc. Examples of these specific embodiments can include about 15% by weight tin, about 0.5% to about 1.5% by weight antimony, about 0.5% to about 1.5% by weight copper, about 1% by weight nickel, about 75% by weight indium, about 6% by weight silver, and about 0.5% to about 1.5% by weight zinc, such as about 15% by weight tin, about 1% by weight antimony, about 1% by weight copper, about 1% by weight nickel, about 75% by weight indium, about 6% by weight silver, and about 1% by weight zinc. Other examples of these specific embodiments can include about 14% by weight tin, about 0.5% to about 1.5% by weight antimony, about 0.5% to about 1.5% by weight copper, about 3% by weight nickel, about 75% by weight indium, about 5% by weight silver, and about 0.5% to about 1.5% by weight zinc, such as about 14% by weight tin, about 1% by weight antimony, about 1% by weight copper, about 3% by weight nickel, about 75% by weight indium, about 5% by weight silver, and about 1% by weight zinc. Still other examples of these specific embodiments can include about 13% by weight tin, about 1.5% to about 2.5% by weight antimony, about 0.5% to about 1.5% by weight copper, about 4% by weight nickel, about 74% by weight indium, about 5% by weight silver, and about 0.5% to about 1.5% by weight zinc, such as about 13% by weight tin, about 2% by weight antimony, about 1% by weight copper, about 4% by weight nickel, about 74% by weight indium, about 5% by weight silver, and about 1% by weight zinc.

In addition to providing environmentally friendly lead-free materials, the solder compositions of the invention have many advantages, such as providing a lead-free composition that can be used on automotive glass, delivering necessary mechanical properties in both strength and ductility and withstanding desired elevated service temperatures, while retaining the desired low manufacturing process temperature.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 2 is a side view of an electrical connector soldered to an electrical contact on the rear window of FIG. 1, with the rear window, electrical contact and solder being shown in section.

FIGS. 4A and 4B are schematic illustrations of power connectors that can be soldered with solder compositions of the invention.

DETAILED DESCRIPTION OF THE INVENTION

Figure 1:
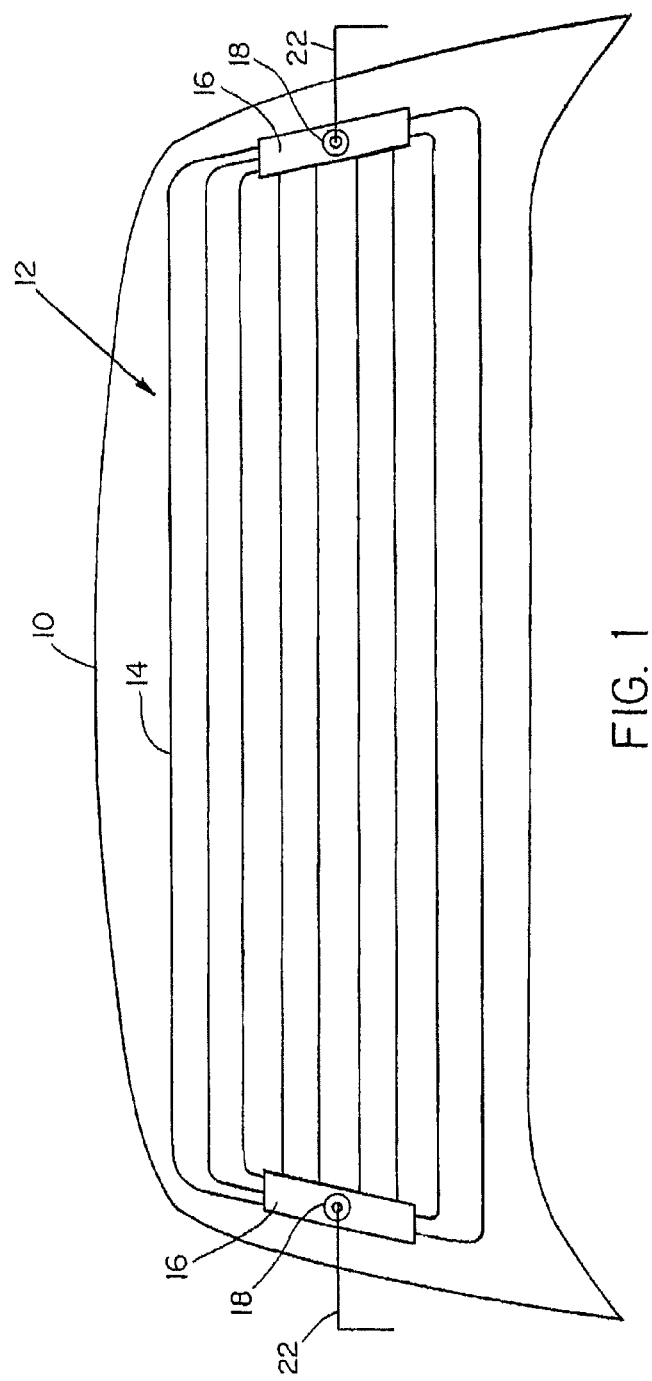
FIG. 1 is an inside view of a rear window of an automobile including an electrically operated defroster.

The present invention provides a solder composition that is suitable for soldering electrical components to glass for electrically connecting to electrical devices within or on the glass. Referring to FIG. 1, the rear window 10 of an automobile (also called a backlight, e.g., in Europe) is employed as an illustrative example. Window (glass component) 10 includes a window defroster 12 consisting of electrically resistive defrosting lines 14 embedded within or deposited on the inner surface of window 10. The defrosting lines 14 are electrically connected to a pair of electrical contact strips (electrical contact surfaces, also referred to as buss bars) 16 located on the inner surface of window 10. The electrical contact strips 16 consist of a conductive coating deposited on the inner surface of window 10. Typically, electrical contact strips 16 are formed from silver-containing material.

There are difficulties encountered when soldering devices to automotive glass that are not present in other applications. To address some concerns of the original equipment manufacturers (OEMs) regarding use of non-lead solders on automotive glass, automotive glass suppliers such as CLEPA (European Association of Automotive Suppliers) have developed several tests, including temperature cycling, constant climactic humidity, climactic temperature with humidity, and high temperature storage. To address the concerns of the OEMs over the melting point of the solder, one test included samples of glass soldered to connectors with the 65 Indium Solder that were stored at 105° C. for 500 hours, during which time weights of 500 grams were hung from each of the connectors, yet no connectors detached from the glass during the test period. The OEMs, such as the European Automobile Manufacturers' Association (ACEA), proposed, however, that temperatures could possibly be as high as 115° C. to 120° C.

The solder composition of the present invention was developed to address the above mentioned concerns of the OEMs. Referring to FIG. 2, the layer of solder composition 20 of the present invention is employed to solder an electrical (i.e., power) connector 18 to each electrical contact strip (i.e., buss bar) 16 on window 10, using standard soldering techniques, such as a resistance soldering device, or flame, micro-flame, hot iron, hot air, and induction heating. Soldering can be conducted in an ambient air atmosphere, without the need for an inert gas environment. Power lines 22 can then be electrically connected to electrical connectors 18 to provide power to window defroster 12 (FIG. 1). Solder performance test and results are provided below.

In one embodiment, the present solder composition 20 includes about 4% to about 25% by weight tin, about 0.1% to about 8% by weight antimony, about 0.03% to about 4% by weight copper, about 0.03% to about 4% by weight nickel, about 66% to about 90% by weight indium, and about 0.5% to about 9% by weight silver.

In some embodiments, the composition 20 includes about 1% to about 7% by weight silver. In certain embodiments, the composition 20 includes about 0.2% to about 8% by weight antimony. In other embodiments, the composition 20 includes about 3% to about 7% by weight silver. In still other embodiments, the composition 20 includes about 1% to about 4% by weight silver.

In certain embodiments, the composition 20 further includes about 0.2% to about 6% by weight zinc. In certain other embodiments, the composition 20 further includes about 0.3% to about 6% by weight zinc. In still other embodiments, the composition 20 further includes about 3% to about 5% by weight zinc.

In certain other embodiments, the composition 20 further includes about 0.01% to about 0.3% by weight germanium. In these specific embodiments, the composition 20 can include about 70% to about 86% by weight indium.

In some embodiments, the composition 20 includes about 7% to about 19% by weight tin, about 0.2% to about 8% by weight antimony, about 0.1% to about 1.5% by weight copper, about 0.1% to about 4% by weight nickel, about 70% to about 80% by weight indium, and about 4% to about 8% by weight silver.

In certain embodiments, the composition 20 includes about 74% to about 78% by weight indium. In these specific embodiments, the composition 20 can include about 5% to about 10% by weight tin, or about 12% to about 19% by weight tin, or about 12% to about 16% by weight tin. In certain other embodiments, the composition 20 includes about 74% to about 80% by weight indium. In still other embodiments, the composition 20 includes about 0.1% to about 3% by weight nickel. In yet other embodiments, the composition 20 includes about 0.2% to about 5% by weight antimony.

In still other embodiments, the composition 20 includes about 11% to about 17% by weight tin, about 0.5% to about 3% by weight antimony, about 0.5% to about 1.5% by weight copper, about 0.5% to about 5% by weight nickel, about 72% to about 77% by weight indium, about 4% to about 7% by weight silver, and about 0.5% to about 1.5% by weight zinc. In these specific embodiments, the composition 20 can include about 13% to about 15% by weight tin, about 0.5% to about 2.5% by weight antimony, about 0.5% to about 1.5% by weight copper, about 1% to about 4% by weight nickel, about 74% to about 75% by weight indium, about 5% to about 6% by weight silver, and about 0.5% to about 1.5% by weight zinc. Examples of these specific embodiments can include about 15% by weight tin, about 0.5% to about 1.5% by weight antimony, about 0.5% to about 1.5% by weight copper, about 1% by weight nickel, about 75% by weight indium, about 6% by weight silver, and about 0.5% to about 1.5% by weight zinc, such as about 15% by weight tin, about 1% by weight antimony, about 1% by weight copper, about 1% by weight nickel, about 75% by weight indium, about 6% by weight silver, and about 1% by weight zinc. Other examples of these specific embodiments can include about 14% by weight tin, about 0.5% to about 1.5% by weight antimony, about 0.5% to about 1.5% by weight copper, about 3% by weight nickel, about 75% by weight indium, about 5% by weight silver, and about 0.5% to about 1.5% by weight zinc, such as about 14% by weight tin, about 1% by weight antimony, about 1% by weight copper, about 3% by weight nickel, about 75% by weight indium, about 5% by weight silver, and about 1% by weight zinc. Still other examples of these specific embodiments can include about 13% by weight tin, about 1.5% to about 2.5% by weight antimony, about 0.5% to about 1.5% by weight copper, about 4% by weight nickel, about 74% by weight indium, about 5% by weight silver, and about 0.5% to about 1.5% by weight zinc, such as about 13% by weight tin, about 2% by weight antimony, about 1% by weight copper, about 4% by weight nickel, about 74% by weight indium, about 5% by weight silver, and about 1% by weight zinc.

The solder composition 20 can have a solidus temperature in a range of between about 120° C. and about 145° C., and a liquidus temperature in a range of between 130° C. and about 155° C. The solidus temperature is practically defined as the temperature at which an alloy begins to melt. Below the solidus temperature, the substance is completely solid, without molten phase. The liquidus temperature is the maximum temperature at which crystals (unmolten metal or alloy) can co-exist with the melt. Above the liquidus temperature, the material is homogeneous, consisting of melt only. The solder processing temperature is higher than the liquidus temperature, by a number of degrees that is determined by the soldering technique.

In a specific embodiment, the composition 20 includes about 14% to about 16% by weight tin, about 0.5% to about 1.5% by weight antimony, about 0.5% to about 1.5% by weight copper, about 0.5% to about 1.5% by weight nickel, about 74% to about 76% by weight indium, and about 6% to about 8% by weight silver, such as about 15% by weight tin, about 1.0% by weight antimony, about 1.0% by weight copper, about 1.0% by weight nickel, about 75% by weight indium, and about 7% by weight silver. Other compositions in this embodiment can include about 14% to about 21% by weight tin, about 0.2% to about 3% by weight antimony, about 0.1% to about 4.0% by weight copper, about 0.1% to about 3.0% by weight nickel, about 72% to about 80% by weight indium, and about 1% to about 8% by weight silver.

In a second specific embodiment, the composition 20 includes about 14% to about 16% by weight tin, about 2% to about 4% by weight antimony, about 0.5% to about 1.5% by weight copper, about 0.5% to about 1.5% by weight nickel, about 74% to about 76% by weight indium, and about 4% to about 6% by weight silver, such as about 15% by weight tin, about 3.0% by weight antimony, about 1.0% by weight copper, about 1.0% by weight nickel, about 75% by weight indium, and about 5% by weight silver.

In a third specific embodiment, the composition 20 includes about 12% to about 14% by weight tin, about 2% to about 4% by weight antimony, about 0.5% to about 1.5% by weight copper, about 2% to about 4% by weight nickel, about 74% to about 76% by weight indium, and about 4% to about 6% by weight silver, such as about 13% by weight tin, about 3.0% by weight antimony, about 1.0% by weight copper, about 3.0% by weight nickel, about 75% by weight indium, and about 5% by weight silver, or about 14% by weight tin, about 3.0% by weight antimony, about 1.0% by weight copper, about 2.0% by weight nickel, about 75% by weight indium, and about 5% by weight silver.

In a fourth specific embodiment, the composition 20 includes about 7% to about 9% by weight tin, about 4% to about 6% by weight antimony, about 0.5% to about 1.5% by weight copper, about 2% to about 4% by weight nickel, about 74% to about 76% by weight indium, about 4% to about 6% by weight silver, and about 2% to about 4% by weight zinc, such as about 8% by weight tin, about 5.0% by weight antimony, about 1.0% by weight copper, about 3.0% by weight nickel, about 75% by weight indium, about 5% by weight silver, and about 3.0% by weight zinc.

In a fifth specific embodiment, the composition 20 includes about 7% to about 9% by weight tin, about 4% to about 6% by weight antimony, about 0.5% to about 1.5% by weight copper, about 0.5% to about 1.5% by weight nickel, about 74% to about 76% by weight indium, about 4% to about 6% by weight silver, and about 4% to about 6% by weight zinc, such as about 8% by weight tin, about 5.0% by weight antimony, about 1.0% by weight copper, about 1.0% by weight nickel, about 75% by weight indium, about 5% by weight silver, and about 5.0% by weight zinc.

In a sixth specific embodiment, the composition 20 includes about 7% to about 9% by weight tin, about 4% to about 6% by weight antimony, about 0.5% to about 1.5% by weight copper, about 2% to about 4% by weight nickel, about 74% to about 76% by weight indium, about 4% to about 6% by weight silver, about 2% to about 4% by weight zinc, and about 0.05% to about 0.2% by weight germanium, such as about 8% by weight tin, about 4.9% by weight antimony, about 1.0% by weight copper, about 3.0% by weight nickel, about 75% by weight indium, about 5% by weight silver, about 3.0% by weight zinc, and about 0.1% by weight germanium.

In some other embodiments, the composition 20 includes about 4% to about 20% by weight tin, about 0.2% to about 8% by weight antimony, about 0.1% to about 4% by weight copper, about 0.1% to about 3% by weight nickel, about 71% to about 86% by weight indium, and about 1% to about 6% by weight silver. In certain embodiments, the composition 20 includes about 10% to about 19% by weight tin. In certain other embodiments, the composition 20 includes about 74% to about 80% by weight indium. In these specific embodiments, the composition 20 can include about 1% to about 7% by weight silver. In some embodiments, the composition 20 can include about 3.5% by weight copper. In certain other embodiments, the composition 20 includes about 0.1% to about 1% by weight nickel. In still other embodiments, the composition 20 includes about 1% to about 2% by weight nickel. In yet other embodiments, the composition 20 includes about 0.2% to about 2% by weight antimony. In still other embodiments, the composition 20 includes about 2% to about 6% by weight antimony.

In a seventh specific embodiment, the composition 20 includes about 18% to about 20% by weight tin, about 0.2% to about 1.0% by weight antimony, about 0.1% to about 1.0% by weight copper, about 0.1% to about 1.0% by weight nickel, about 77% to about 80% by weight indium, and about 1% to about 3% by weight silver, such as about 18.99% by weight tin, about 0.24% by weight antimony, about 0.18% by weight copper, about 0.30% by weight nickel, about 78.70% by weight indium, and about 1.48% by weight silver. The melting point or temperature (liquidus) of this specific embodiment was about 135° C. and the solidus was about 124° C.

In an eighth specific embodiment, the composition 20 includes about 13% to about 16% by weight tin, about 1.0% to about 3.0% by weight antimony, about 3.0% to about 4.0% by weight copper, about 0.2% to about 1.5% by weight nickel, about 74% to about 76% by weight indium, and about 3% to about 5% by weight silver, such as about 14.77% by weight tin, about 1.93% by weight antimony, about 3.50% by weight copper, about 0.60% by weight nickel, about 74.91% by weight indium, and about 3.87% by weight silver. The melting point or temperature (liquidus) of this specific embodiment was about 135° C. and the solidus was about 123° C.

In a ninth specific embodiment, the composition 20 includes about 11% to about 14% by weight tin, about 2.0% to about 4% by weight antimony, about 0.5% to about 2% by weight copper, about 1.0% to about 3% by weight nickel, about 76% to about 79% by weight indium, and about 2% to about 5% by weight silver, such as about 12.68% by weight tin, about 2.91% by weight antimony, about 1.22% by weight copper, about 1.87% by weight nickel, about 77.30% by weight indium, and about 3.54% by weight silver. The melting point or temperature (liquidus) of this specific embodiment was about 138° C. and the solidus was about 127° C.

In a tenth specific embodiment, the composition 20 includes about 6% to about 9% by weight tin, about 3.0% to about 5% by weight antimony, about 0.5% to about 1.5% by weight copper, about 1.0% to about 3% by weight nickel, about 76% to about 79% by weight indium, about 4% to about 6% by weight silver, and about 2% to about 4% by weight zinc, such as about 7.66% by weight tin, about 3.75% by weight antimony, about 0.92% by weight copper, about 1.88% by weight nickel, about 77.30% by weight indium, about 5.21% by weight silver, and about 3.17% by weight zinc. The melting point or temperature (liquidus) of this specific embodiment was about 143.4° C. and the solidus was about 129° C.

In an eleventh specific embodiment, the composition 20 includes about 7% to about 9% by weight tin, about 4% to about 6% by weight antimony, about 0.2% to about 1.0% by weight copper, about 0.2% to about 1.5% by weight nickel, about 73% to about 76% by weight indium, about 4% to about 6% by weight silver, and about 4% to about 6% by weight zinc, such as about 8.45% by weight tin, about 5.42% by weight antimony, about 0.40% by weight copper, about 0.54% by weight nickel, about 74.21% by weight indium, about 5.54% by weight silver, and about 4.86% by weight zinc. The melting point or temperature (liquidus) of this specific embodiment was about 139.4° C. and the solidus was about 127° C.

In a twelfth specific embodiment, the composition 20 includes about 4% to about 6% by weight tin, about 1.0% to about 2.0% by weight antimony, about 0.1% to about 2% by weight copper, about 0.1% to about 1.0% by weight nickel, about 84% to about 86% by weight indium, about 1% to about 2% by weight silver, about 0.2% to about 1% by weight zinc, and less than about 0.001% to about 0.15% by weight germanium, such as about 5.31% by weight tin, about 1.52% by weight antimony, about 1.07% by weight copper, about 0.15% by weight nickel, about 85.56% by weight indium, about 1.45% by weight silver, about 0.46% by weight zinc, and less than about 0.001% by weight germanium. The melting point or temperature (liquidus) of this specific embodiment was about 140° C. and the solidus was about 132.4° C.

In a thirteenth specific embodiment, the composition 20 includes about 18% to about 20% by weight tin, about 0.2% to about 2% by weight antimony, about 0.1% to about 4.0% by weight copper, about 0.1% to about 3.0% by weight nickel, about 72% to about 75% by weight indium, and about 1% to about 4% by weight silver, such as about 19.49% by weight tin, about 1.03% by weight antimony, about 2.84% by weight copper, about 1.26% by weight nickel, about 73.62% by weight indium, and about 2.79% by weight silver. The melting point or temperature (liquidus) of this specific embodiment was about 134.71° C. and the solidus was about 123.74° C.

In a fourteenth specific embodiment, the composition 20 includes about 16% to about 19% by weight tin, about 3.0% to about 6.0% by weight antimony, about 2.0% to about 4.0% by weight copper, about 0.5% to about 3.0% by weight nickel, about 70% to about 73% by weight indium, and about 1% to about 4% by weight silver, such as about 18.23% by weight tin, about 4.57% by weight antimony, about 2.7% by weight copper, about 1.49% by weight nickel, about 71.05% by weight indium, and about 2.60% by weight silver. The melting point or temperature (liquidus) of this specific embodiment was about 135.52° C. and the solidus was about 122.98° C.

In a fifteenth specific embodiment, the composition 20 includes about 15% to about 18% by weight tin, about 1.0% to about 4% by weight antimony, about 1.5% to about 3.5% by weight copper, about 1.0% to about 4% by weight nickel, about 71% to about 75% by weight indium, and about 2% to about 5% by weight silver, such as about 16.95% by weight tin, about 2.69% by weight antimony, about 2.4% by weight copper, about 2.82% by weight nickel, about 72.84% by weight indium, and about 3.31% by weight silver. The melting point or temperature (liquidus) of this specific embodiment was about 139.01° C. and the solidus was about 125.39° C.

In a sixteenth specific embodiment, the composition 20 includes about 7% to about 11% by weight tin, about 3.0% to about 5% by weight antimony, about 1.5% to about 3.5% by weight copper, about 0.5% to about 3% by weight nickel, about 79% to about 82% by weight indium, about 1.0% to about 4% by weight silver, and about 0.01% to about 1% by weight zinc, such as about 9.02% by weight tin, about 4.12% by weight antimony, about 2.21% by weight copper, about 1.09% by weight nickel, about 80.12% by weight indium, about 2.80% by weight silver, and about 0.05% by weight zinc. The melting point or temperature (liquidus) of this specific embodiment was about 142.11° C. and the solidus was about 130.91° C.

In a seventeenth specific embodiment, the composition 20 includes about 9% to about 12% by weight tin, about 4% to about 6% by weight antimony, about 1.5% to about 3.5% by weight copper, about 0.5% to about 3.0% by weight nickel, about 75% to about 78% by weight indium, about 1% to about 3% by weight silver, and about 0.01% to about 1% by weight zinc, such as about 10.69% by weight tin, about 5.32% by weight antimony, about 2.58% by weight copper, about 1.55% by weight nickel, about 76.03% by weight indium, about 2.11% by weight silver, and about 0.05% by weight zinc. The melting point or temperature (liquidus) of this specific embodiment was about 140.37° C. and the solidus was about 126.93° C.

In an eighteenth specific embodiment, the composition 20 includes about 8% to about 10% by weight tin, about 2.0% to about 5.0% by weight antimony, about 2% to about 4% by weight copper, about 0.5% to about 3.0% by weight nickel, about 79% to about 82% by weight indium, about 2% to about 4% by weight silver, about 0.01% to about 1% by weight zinc, and less than about 0.001% to about 0.15% by weight germanium, such as about 9.03% by weight tin, about 3.43% by weight antimony, about 3% by weight copper, about 0.95% by weight nickel, about 80.57% by weight indium, about 3.32% by weight silver, about 0.1% by weight zinc, and less than about 0.001% Germanium. The melting point or temperature (liquidus) of this specific embodiment was about 141.67° C. and the solidus was about 130.30° C.

In a nineteenth specific embodiment, the composition 20 includes about 10% to about 14% by weight tin, about 0.5% to about 1.5% by weight antimony, about 0.5% to about 1.5% by weight copper, about 0.5% to about 1.5% by weight nickel, about 73% to about 77% by weight indium, about 5% to about 9% by weight silver, and about 2% to about 4% by weight zinc, such as about 12% by weight tin, about 1% by weight antimony, about 1% by weight copper, about 1% by weight nickel, about 75% by weight indium, about 7% by weight silver, and about 3% by weight zinc.

In a twentieth specific embodiment, the composition 20 includes about 6% to about 10% by weight tin, about 3% to about 7% by weight antimony, about 0.5% to about 1.5% by weight copper, about 2% to about 4% by weight nickel, about 73% to about 77% by weight indium, about 3% to about 7% by weight silver, and about 2% to about 4% by weight zinc, such as about 8% by weight tin, about 5% by weight antimony, about 1% by weight copper, about 3% by weight nickel, about 75% by weight indium, about 5% by weight silver, and about 3% by weight zinc.

In a twentyfirst specific embodiment, the composition 20 includes about 12% to about 16% by weight tin, about 0.5% to about 1.5% by weight antimony, about 0.5% to about 1.5% by weight copper, about 0.5% to about 1.5% by weight nickel, about 0.5% to about 1.5% by weight zinc, about 73% to about 77% by weight indium, and about 5% to about 9% by weight silver, such as about 14% by weight tin, about 1% by weight antimony, about 1% by weight copper, about 1% by weight nickel, about 1% by weight zinc, about 75% by weight indium, and about 7% by weight silver.

In a twentysecond specific embodiment, the composition 20 includes about 20% to about 24% by weight tin, about 0.5% to about 1.5% by weight antimony, about 0.5% to about 1.5% by weight copper, about 0.5% to about 1.5% by weight nickel, about 66% to about 70% by weight indium, and about 5% to about 9% by weight silver, such as about 22% by weight tin, about 1% by weight antimony, about 1% by weight copper, about 1% by weight nickel, about 68% by weight indium, and about 7% by weight silver.

In a twentythird specific embodiment, the composition 20 includes about 18% to about 22% by weight tin, about 0.5% to about 1.5% by weight antimony, about 2% to about 4% by weight copper, about 0.5% to about 1.5% by weight nickel, about 66% to about 70% by weight indium, and about 5% to about 9% by weight silver, such as about 20% by weight tin, about 1% by weight antimony, about 3% by weight copper, about 1% by weight nickel, about 68% by weight indium, and about 7% by weight silver.

In a twentyfourth specific embodiment, the composition 20 includes about 12% to about 16% by weight tin, about 1% to about 3% by weight antimony, about 0.5% to about 1.5% by weight copper, about 0.5% to about 1.5% by weight nickel, about 73% to about 77% by weight indium, and about 5% to about 9% by weight silver, such as about 14% by weight tin, about 2% by weight antimony, about 1% by weight copper, about 1% by weight nickel, about 75% by weight indium, and about 7% by weight silver.

In a twentyfifth specific embodiment, the composition 20 includes about 11% to about 15% by weight tin, about 2% to about 4% by weight antimony, about 0.5% to about 1.5% by weight copper, about 0.5% to about 1.5% by weight nickel, about 73% to about 77% by weight indium, and about 5% to about 9% by weight silver, such as about 13% by weight tin, about 3% by weight antimony, about 1% by weight copper, about 1% by weight nickel, about 75% by weight indium, and about 7% by weight silver.

In a twentysixth specific embodiment, the composition 20 includes about 14% to about 18% by weight tin, about 2% to about 4% by weight antimony, about 0.5% to about 1.5% by weight copper, about 0.5% to about 1.5% by weight nickel, about 70% to about 74% by weight indium, and about 5% to about 9% by weight silver, such as about 16% by weight tin, about 3% by weight antimony, about 1% by weight copper, about 1% by weight nickel, about 72% by weight indium, and about 7% by weight silver.

In a twentyseventh specific embodiment, the composition 20 includes about 18% to about 22% by weight tin, about 2% to about 4% by weight antimony, about 0.5% to about 1.5% by weight copper, about 0.5% to about 1.5% by weight nickel, about 66% to about 70% by weight indium, and about 5% to about 9% by weight silver, such as about 20% by weight tin, about 3% by weight antimony, about 1% by weight copper, about 1% by weight nickel, about 68% by weight indium, and about 7% by weight silver.

In a twentyeighth specific embodiment, the composition 20 includes about 13% to about 17% by weight tin, about 0.5% to about 1.5% by weight antimony, about 0.5% to about 1.5% by weight copper, about 0.5% to about 1.5% by weight nickel, about 73% to about 77% by weight indium, and about 5% to about 9% by weight silver, such as about 15% by weight tin, about 1% by weight antimony, about 1% by weight copper, about 1% by weight nickel, about 75% by weight indium, and about 7% by weight silver.

In a twentyninth specific embodiment, the composition 20 includes about 13% to about 17% by weight tin, about 0.5% to about 1.5% by weight antimony, about 0.5% to about 1.5% by weight copper, about 0.5% to about 1.5% by weight nickel, about 0.5% to about 1.5% by weight zinc, about 73% to about 77% by weight indium, and about 5% to about 8.5% by weight silver, such as about 14.05% by weight tin, about 0.98% by weight antimony, about 0.87% by weight copper, about 0.70% by weight nickel, about 0.63% by weight zinc, about 74.74% by weight indium, and about 7.98% by weight silver. The melting point or temperature (liquidus) of this solder composition was about 133.18° C. and the solidus was about 123.94° C.

In a thirtieth specific embodiment, the composition 20 includes about 12% to about 16% by weight tin, about 0.5% to about 1.5% by weight antimony, about 0.5% to about 1.5% by weight copper, about 2% to about 4% by weight nickel, about 0.5% to about 1.5% by weight zinc, about 73% to about 77% by weight indium, and about 3% to about 7% by weight silver, such as about 14.14% by weight tin, about 0.76% by weight antimony, about 0.64% by weight copper, about 2.24% by weight nickel, about 0.75% by weight zinc, about 76.07% by weight indium, and about 5.81% by weight silver. The melting point or temperature (liquidus) of this solder composition was about 137.58° C. and the solidus was about 125.92° C.

In a thirtyfirst specific embodiment, the composition 20 includes about 11% to about 15% by weight tin, about 1% to about 3% by weight antimony, about 0.5% to about 1.5% by weight copper, about 3% to about 5% by weight nickel, about 0.3% to about 1.5% by weight zinc, about 72% to about 76% by weight indium, and about 4% to about 6% by weight silver, such as about 13.43% by weight tin, about 1.31% by weight antimony, about 0.94% by weight copper, about 2.65% by weight nickel, about 0.49% by weight zinc, about 72.97% by weight indium, and about 7.54% by weight silver. The melting point or temperature (liquidus) of this solder composition was about 140.64° C. and the solidus was about 129.24° C.

In a thirtysecond specific embodiment, the composition 20 consists essentially of about 13% to about 17% by weight tin, about 0.5% to about 1.5% by weight antimony, about 0.5% to about 1.5% by weight copper, about 0.5% to about 1.5% by weight nickel, about 0.5% to about 1.5% by weight zinc, about 73% to about 77% by weight indium, and about 5% to about 8.5% by weight silver, such as about 14.05% by weight tin, about 0.98% by weight antimony, about 0.87% by weight copper, about 0.70% by weight nickel, about 0.63% by weight zinc, about 74.74% by weight indium, and about 7.98% by weight silver. The melting point or temperature (liquidus) of this solder composition was about 133.18° C. and the solidus was about 123.94° C. The resistivity of this solder composition was about $16.24 \times 10^{-6}$ Ω-cm.

As used in the instant application, in some embodiments, solder compositions consisting essentially of the listed materials are limited to the specified materials and those that do not materially affect the basic and novel characteristics of the solder compositions and electrical connectors including the solder compositions. The basic and novel characteristics of the solder compositions include the thermal (e.g., liquidus and solidus temperatures) and mechanical (e.g., performance tests described below) properties described herein.

In a thirtythird specific embodiment, the composition 20 consists essentially of about 12% to about 16% by weight tin, about 0.5% to about 1.5% by weight antimony, about 0.5% to about 1.5% by weight copper, about 2% to about 4% by weight nickel, about 0.5% to about 1.5% by weight zinc, about 73% to about 77% by weight indium, and about 3% to about 7% by weight silver, such as about 14.14% by weight tin, about 0.76% by weight antimony, about 0.64% by weight copper, about 2.24% by weight nickel, about 0.75% by weight zinc, about 76.07% by weight indium, and about 5.81% by weight silver. The melting point or temperature (liquidus) of this solder composition was about 137.58° C. and the solidus was about 125.92° C.

In a thirtyfourth specific embodiment, the composition 20 consists essentially of about 11% to about 15% by weight tin, about 1% to about 3% by weight antimony, about 0.5% to about 1.5% by weight copper, about 3% to about 5% by weight nickel, about 0.3% to about 1.5% by weight zinc, about 72% to about 76% by weight indium, and about 4% to about 8% by weight silver, such as about 13.43% by weight tin, about 1.31% by weight antimony, about 0.94% by weight copper, about 2.65% by weight nickel, about 0.49% by weight zinc, about 72.97% by weight indium, and about 7.54% by weight silver. The melting point or temperature (liquidus) of this solder composition was about 140.64° C. and the solidus was about 129.24° C.

Other compositions can include about 8% by weight tin, about 10% by weight antimony, about 1% by weight copper, about 1% by weight nickel, about 75% by weight indium, and about 5% by weight silver, or about 11% by weight tin, about 10% by weight antimony, about 1% by weight copper, about 1% by weight nickel, about 72% by weight indium, and about 5% by weight silver, or about 14% by weight tin, about 1% by weight antimony, about 1% by weight copper, about 1% by weight nickel, about 1% by weight germanium, about 75% by weight indium, and about 7% by weight silver, or about 21% by weight tin, about 1% by weight antimony, about 1% by weight copper, about 68% by weight indium, and about 9% by weight silver, or about 22% by weight tin, about 1% by weight antimony, about 5% by weight copper, about 1% by weight nickel, about 68% by weight indium, and about 7% by weight silver, or about 16% by weight tin, about 1% by weight antimony, about 5% by weight copper, about 1% by weight nickel, about 68% by weight indium, and about 9% by weight silver, or about 17% by weight tin, about 1% by weight antimony, about 5% by weight copper, about 68% by weight indium, and about 9% by weight silver, or about 16% by weight tin, about 3% by weight antimony, about 1% by weight copper, about 75% by weight indium, and about 5% by weight silver.

The invention is also directed to an electrical connection on a glass component, as shown in FIGS. 1 and 2, that includes a glass component, an electrical contact surface containing silver on the glass component, and an electrical connector soldered to the electrical contact surface on the glass component with a layer of a solder composition having a mixture of elements comprising about 4% to about 25% by weight tin, about 0.1% to about 8% by weight antimony, about 0.03% to about 4% by weight copper, about 0.03% to about 4% by weight nickel, about 66% to about 90% by weight indium, and about 0.5% to about 9% by weight silver. In other embodiments, an electrical connection on a glass component includes a glass component, an electrical contact surface containing silver on the glass component, and an electrical connector soldered to the electrical contact surface on the glass component with a layer of a solder composition consisting essentially of about 4% to about 25% by weight tin, about 0.1% to about 8% by weight antimony, about 0.03% to about 4% by weight copper, about 0.03% to about 4% by weight nickel, about 66% to about 90% by weight indium, and about 0.5% to about 9% by weight silver.

Figure 3A:
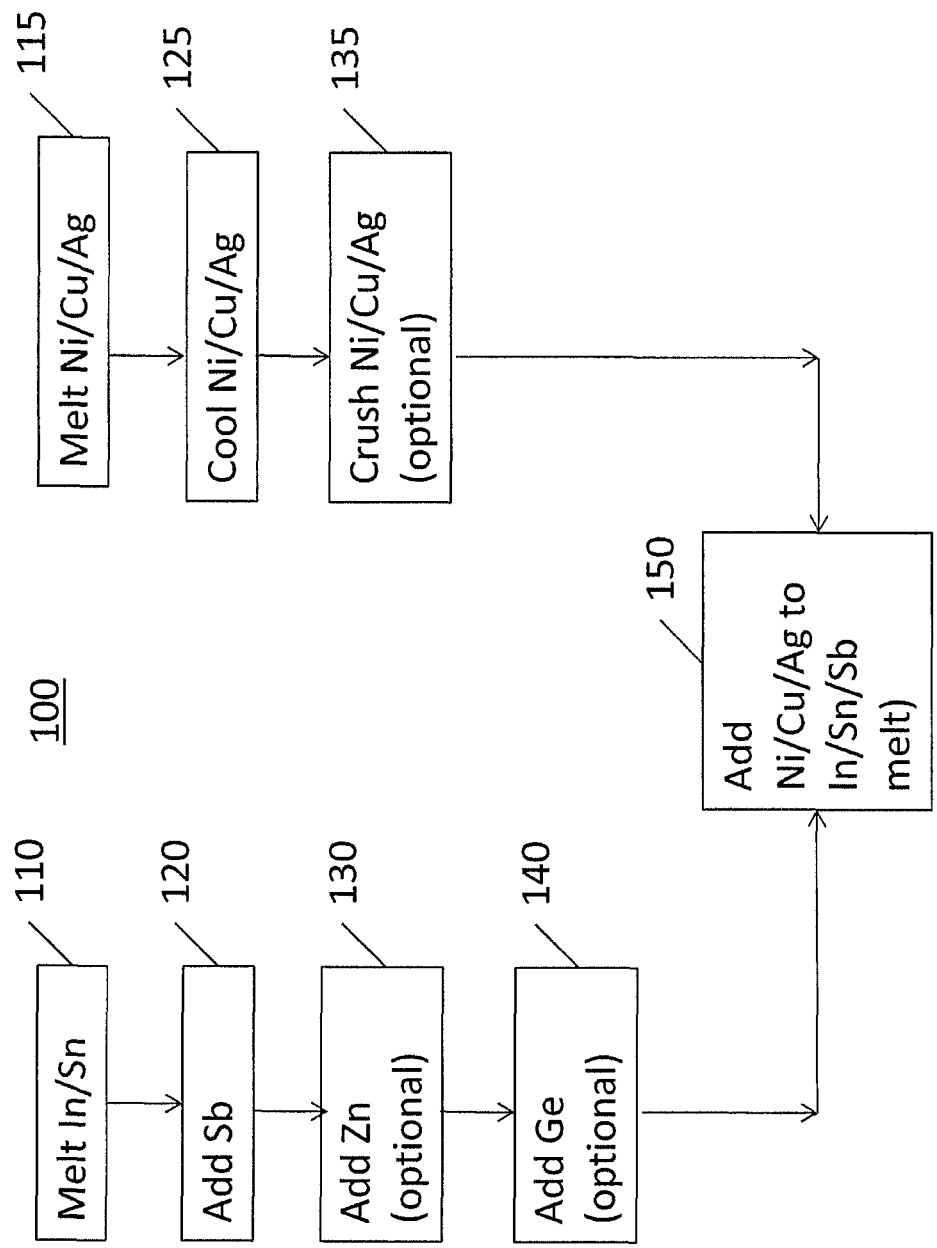
FIG. 3A is a schematic illustration of a flow chart of a method of forming embodiments of solder compositions in the invention.

A method 100, shown in FIG. 3A, of forming the solder composition 20 includes mixing indium, nickel, copper, silver, antimony, and tin together to form an alloy that includes about 66% to about 90% by weight indium, about 0.5% to about 9% by weight silver, about 0.03% to about 3% be weight nickel, about 0.03% to about 4% by weight copper, about 0.1% to about 8% by weight antimony, and about 4% to about 25% by weight tin. The method 100 includes melting indium and tin at step 110 and adding antimony at step 120. The method 100 can optionally include mixing, at step 130, about 0.3% to about 5% by weight zinc, and optionally mixing, at step 140, about 0.01% to about 0.3% by weight germanium. In some embodiments, the indium and tin are mixed together in a first molten mixture at step 110, and at least nickel, copper and silver are mixed together in solution at step 115 in a second mixture, which is then cooled at step 125, optionally crushed at step 135, and then added at step 150 to the first molten mixture. A flowchart of the method of forming the solder composition 20 is shown in FIG. 3A. The method can be conducted in an ambient air atmosphere, without the need for an inert gas environment or vacuum.

In some embodiments, indium is mixed in a proportion of about 70% to about 80% by weight, silver is mixed in a proportion of about 4% to about 8% by weight, nickel is mixed in a proportion of about 0.1% to about 4% by weight, copper is mixed in a proportion of about 0.1% to about 1.5% by weight, antimony is mixed in a proportion of about 0.2% to about 8% by weight, and tin is mixed in a proportion of about 7% to about 19% by weight. The resulting alloy has indium, silver, nickel, copper, antimony, tin, and, optionally, zinc and germanium in proportions described above for solder composition 20.

In other embodiments, method 100 of forming the solder composition 20 includes mixing indium, nickel, copper, zinc, silver, antimony, and tin together to form an alloy that includes about 72% to about 77% by weight indium, about 4% to about 8.5% by weight silver, about 0.5% to about 5% by weight nickel, about 0.5% to about 1.5% by weight copper, about 0.3% to about 1.5% by weight zinc, about 0.5% to about 3% by weight antimony, and about 11% to about 17% by weight tin. In these specific embodiments, the composition 20 can include about 74% to about 75% by weight indium, about 5% to about 6% by weight silver, about 1% to about 4% by weight nickel, about 0.5% to about 1.5% by weight copper, about 0.5% to about 1.5% by weight zinc, about 0.5% to about 2.5% by weight antimony, and about 13% to about 15% by weight tin. Examples of these specific embodiments can include about 75% by weight indium, about 6% by weight silver, about 1% by weight nickel, about 0.5% to about 1.5% by weight copper, about 0.5% to about 1.5% by weight zinc, about 0.5% to about 1.5% by weight antimony, and about 15% by weight tin, such as about 75% by weight indium, about 6% by weight silver, about 1% by weight nickel, about 1% by weight copper, about 1% by weight zinc, about 1% by weight antimony, and about 15% by weight tin. Other examples of these specific embodiments can include about 75% by weight indium, about 5% by weight silver, about 3% by weight nickel, about 0.5% to about 1.5% by weight copper, about 0.5% to about 1.5% by weight zinc, about 0.5% to about 1.5% by weight antimony, and about 14% by weight tin, such as about 75% by weight indium, about 5% by weight silver, about 3% by weight nickel, about 1% by weight copper, about 1% by weight zinc, about 1% by weight antimony, and about 14% by weight tin. Still other examples of these specific embodiments can include about 74% by weight indium, about 5% by weight silver, about 4% by weight nickel, about 0.5% to about 1.5% by weight copper, about 0.5% to about 1.5% by weight zinc, about 1.5% to about 2.5% by weight antimony, and about 13% by weight tin, such as about 74% by weight indium, about 5% by weight silver, about 4% by weight nickel, about 1% by weight copper, about 1% by weight zinc, about 2% by weight antimony, and about 13% by weight tin.

Figure 3B:
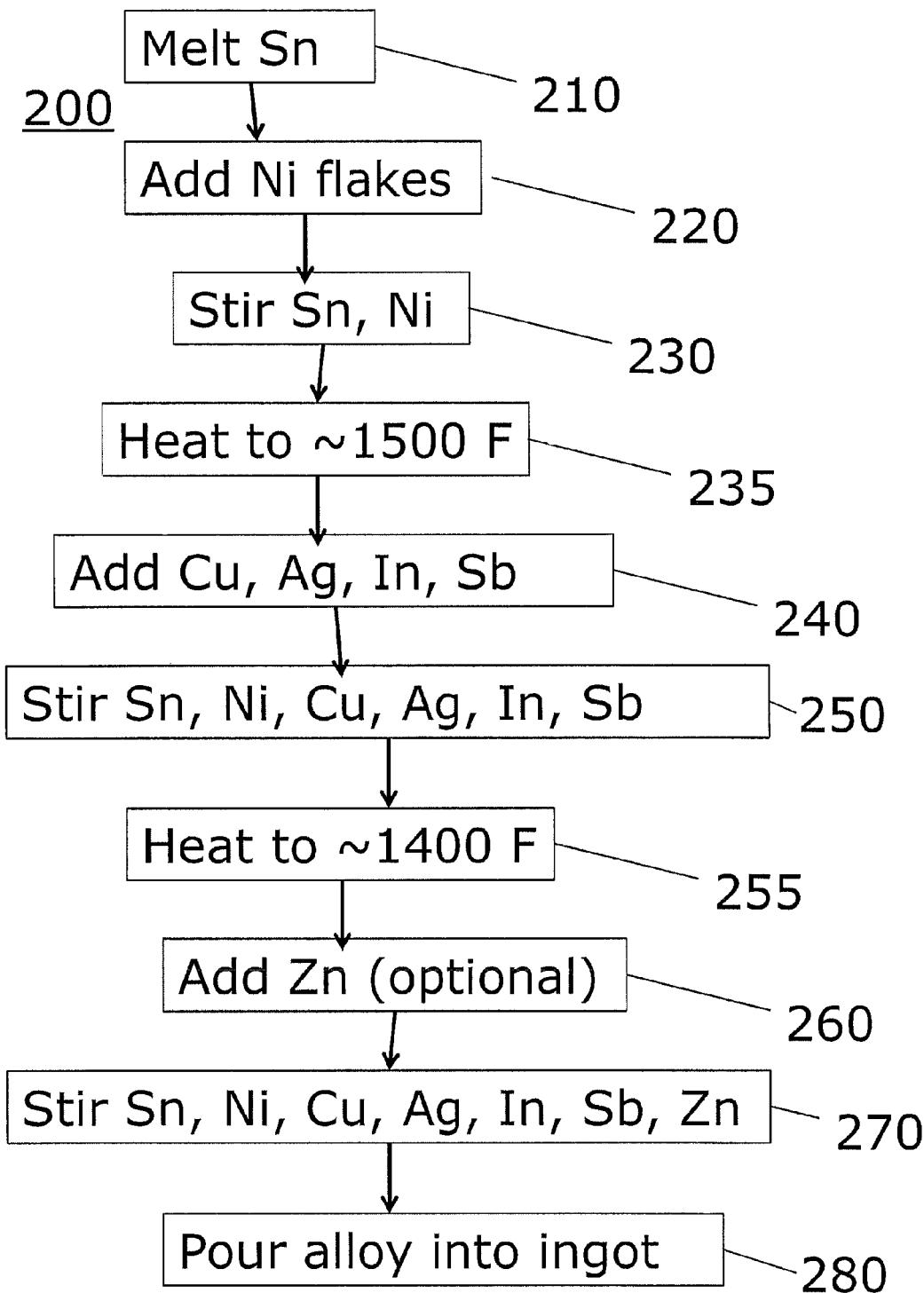
FIG. 3B is a schematic illustration of a flow chart of another method of forming embodiments of solder compositions in the invention.

Another method 200, shown in FIG. 3B, of forming the solder composition 20 described above includes, at step 210, heating the desired amount of tin (Sn) in a high temperature furnace pot, such as an induction heated solder pot (e.g., S. M. Manfredy, Model N.481), until the tin is completely melted. The induction heated solder pot is a convenient furnace for heating relatively small batches of solder to a high temperature, but it requires that subsequent additions of ingredients and stirring of the molten mixture in the pot be performed while the current (heating) is turned off, for safety reasons. At step 220, the pot is turned off and the desired amount of nickel (Ni) is added in the form of flakes, preferably ³⁄₁₆" squares about 0.010" in thickness. All other metals described below can be added in ingot form. It was observed that, with stirring, nickel flakes adhered to the molten mixture and melted into solution more readily than nickel powder, and melting the nickel into solution is relatively difficult in part because nickel is the highest melting (m.p. 1455° C.) of the metals in this solder composition. After stirring the nickel into solution at step 230, the pot is turned on to high heat, for about 10 minutes, until the temperature of the melt reaches about 1500° F. Then, at step 240, the pot is turned off again and the desired amount of copper (Cu), silver (Ag), indium (In), antimony (Sb), and, optionally germanium (Ge) are added and stirred, at step 250, until they are melted into the metal solution. Then, at step 255 the pot is turned on to high heat until the temperature of the melt reaches about 1400° F. At step 260, the pot is turned off, and the desired (optional) amount of zinc (Zn) is added and stirred until melted into the metal solution. The pot is then turned on to low heat for a few minutes to equilibrate the metal solution, after which the alloy is ready to pour into ingots. It was observed that zinc needs to be added as the last ingredient, because it is relatively low melting (m.p. 419.5° C.) and excessive exposure of the zinc-containing metal solution to high temperature can cause the zinc to vaporize out of the metal solution.

Roles of Elements in the Solder Composition

The solder composition of the invention is a non-lead alloy that delivers the higher service temperature, as well as the mechanical properties in both strength and ductility, and physical properties in wetting and stability as needed for the subject applications, while offering the desired manufacturability. The desired manufacturability includes enabling a low enough process temperature so that manufacturing-prone defects or failures and the silver leaching (scavenging) phenomenon that often occurs in soldering silver-containing metalized electrical contact surfaces can be alleviated or eliminated. This is accomplished by an indium-based material that is metallurgically alloyed or precipitated or dispersed with antimony, copper, nickel, silver, tin, and, optionally, germanium and zinc.

Nickel and copper, in combination with the other elements, contribute to the overall performance, including the desired increase in processing temperature, and also contribute to the mechanical properties under the designated process conditions. Nickel and copper can be effective when added even in small amounts, such as 0.03% by weight. These amounts are larger than the generally accepted impurity level for nickel (0.01%), and larger than the generally accepted impurity level for copper in an application that does not include soldering to a printed circuit board with copper circuits. Antimony, in combination with the other elements, contributes to achieving the desired temperature range. Antimony can be effective when added even in small amounts, such as 0.1% by weight. Zinc, in combination with the other elements, contributes to increasing the strength of the alloy without substantially reducing the processing temperature. Zinc can be effective when added even in small amounts, such as 0.3% by weight, which is larger than the generally accepted impurity level for zinc (0.003%). Germanium, in combination with the other elements, can contribute to the processability of the solder composition due to its antioxidizing properties, even though germanium may not be in some instances readily detectable in the composition. Germanium can be effective when added even in small amounts, such as 0.01% by weight or less.

EXEMPLIFICATION

Specific examples of weight % results of solder composition 20 were obtained by inductively coupled plasma atomic emission spectroscopy (ICP-AEC). The solidus and liquidus temperature results were obtained by differential scanning calorimetry (DSC).

Solder Performance Tests and Results

I. Temperature Cycling Test

Figure 5:
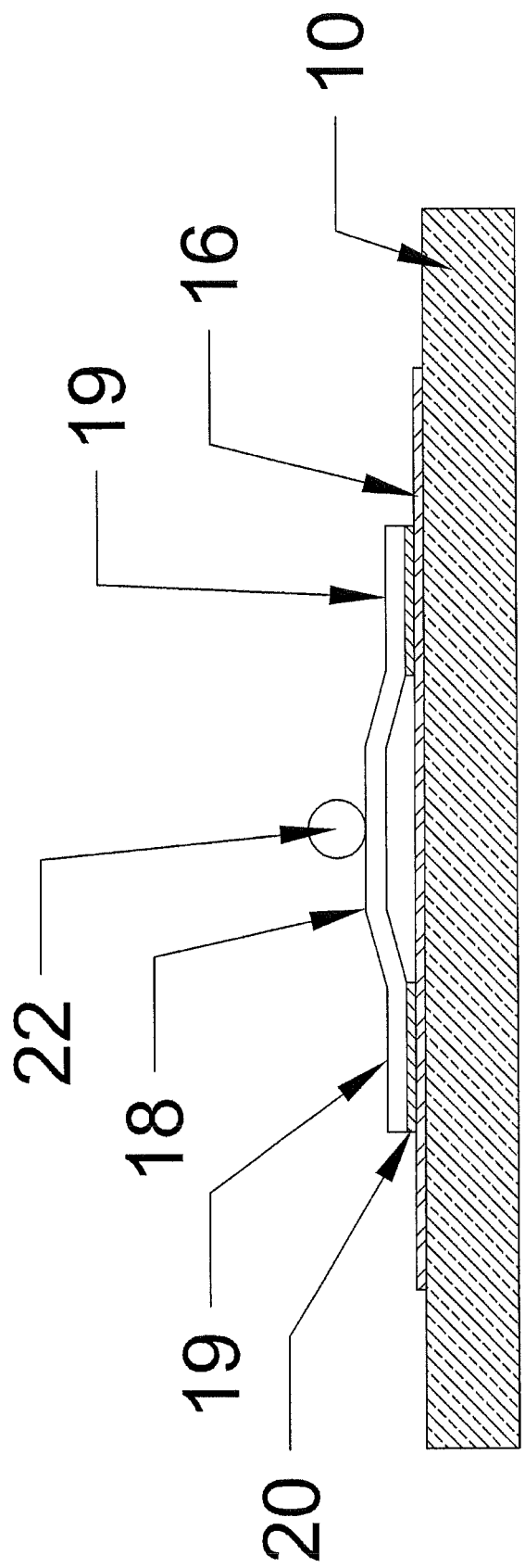
FIG. 5 is a schematic illustration of a power connector soldered onto a windshield with solder compositions of the invention.
Figure 6:
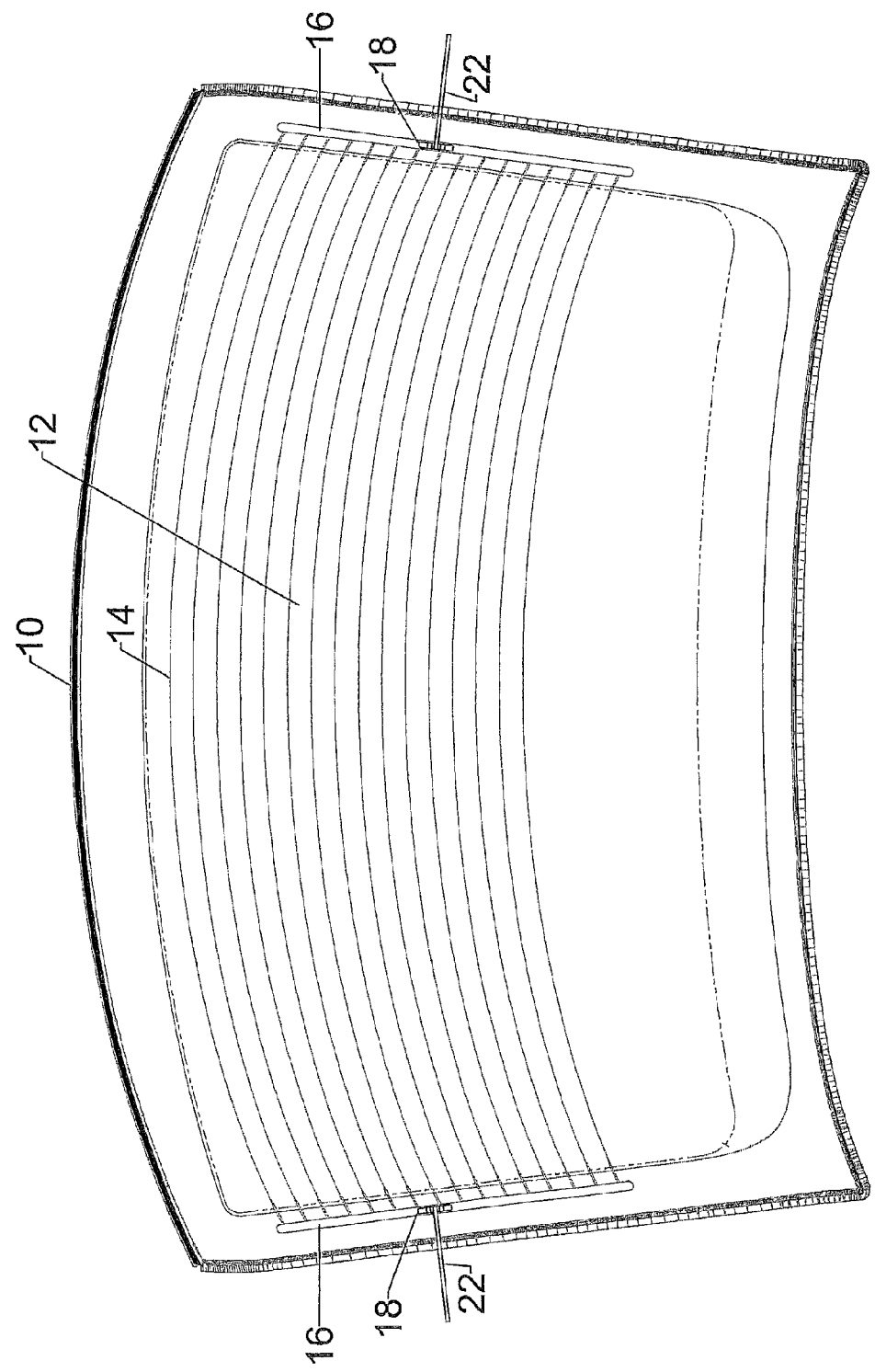
FIG. 6 is a schematic illustration of a windshield assembly employing solder compositions of the invention.

This test was performed according to DIN EN ISO 16750-4-H section 5.3.1.2. The test samples were 11 glass windshields (4 large, 4 medium, and 3 small) with power connectors soldered with a specific embodiment of the solder composition of the present invention. Schematic illustrations of bridge terminal power connectors 18a and 18b, each having a raised elongate bridge portion extending between two spaced apart solder pads 19 on opposite ends, are shown in FIGS. 4A and 4B, respectively. The power connectors 18a and 18b are referred to hereinafter as power connectors 18. The area of each solder pad 19 was about 64 mm², and, as shown in FIG. 5, the solder composition 20 had a thickness of about 0.5 mm. The power connectors 18 were soldered onto the windshield 10 by rolling the solder ingot into a solder ribbon, reflowing the solder ribbon onto a base copper material in a continuous stripe, skiving the solder stripe to a uniform dimension, stamping and forming the terminal using standard tooling, applying flux to the solder surface, and soldering the power connector 18 to the target area of the electrical contact strip 16 on the windshield 10 using a resistance soldering device, with an energy input in a range of between about 750 watt-seconds and about 1050 watt-seconds, such as about 900 watt-seconds, followed by cooling while the power connector 18 was held in place on the windshield 10 for a time period in a range of between about 8 seconds and about 12 seconds, such as about 10 seconds. The solder composition 20 consisted essentially of about 14.05% by weight tin, about 0.98% by weight antimony, about 0.87% by weight copper, about 0.70% by weight nickel, about 0.63% by weight zinc, about 74.74% by weight indium, and about 7.98% by weight silver. The melting point or temperature (liquidus) of this solder composition was about 133.18° C. and the solidus was about 123.94° C. A schematic illustration of the completed assembly including power connectors 18 connected to electrical contact strips 16 and to power lines 22 on windshield 10 is shown in FIG. 6.

Figure 7:
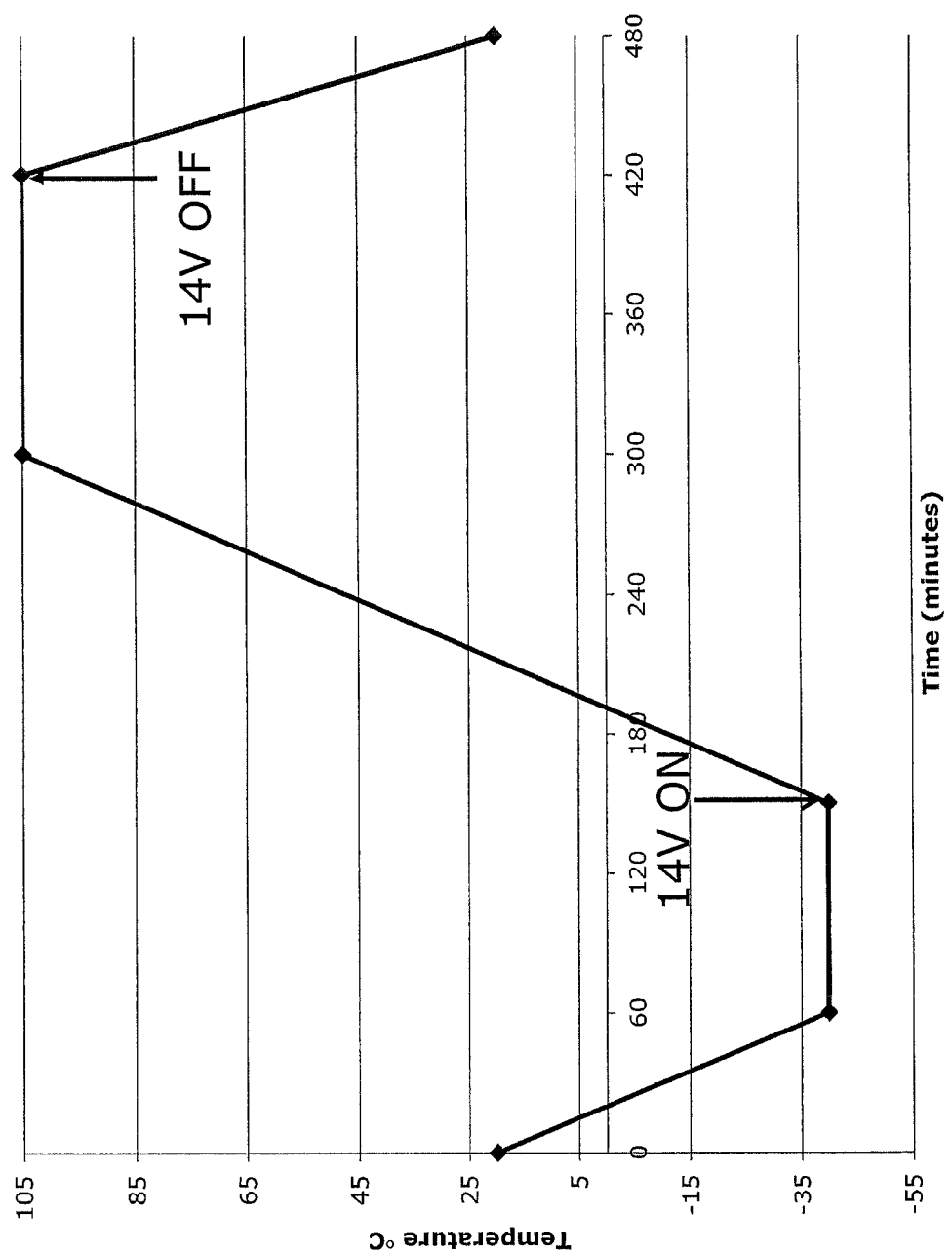
FIG. 7 is a graph of temperature as a function of time during one cycle of a temperature cycling test of embodiments of solder compositions of the invention.
Figure 8:
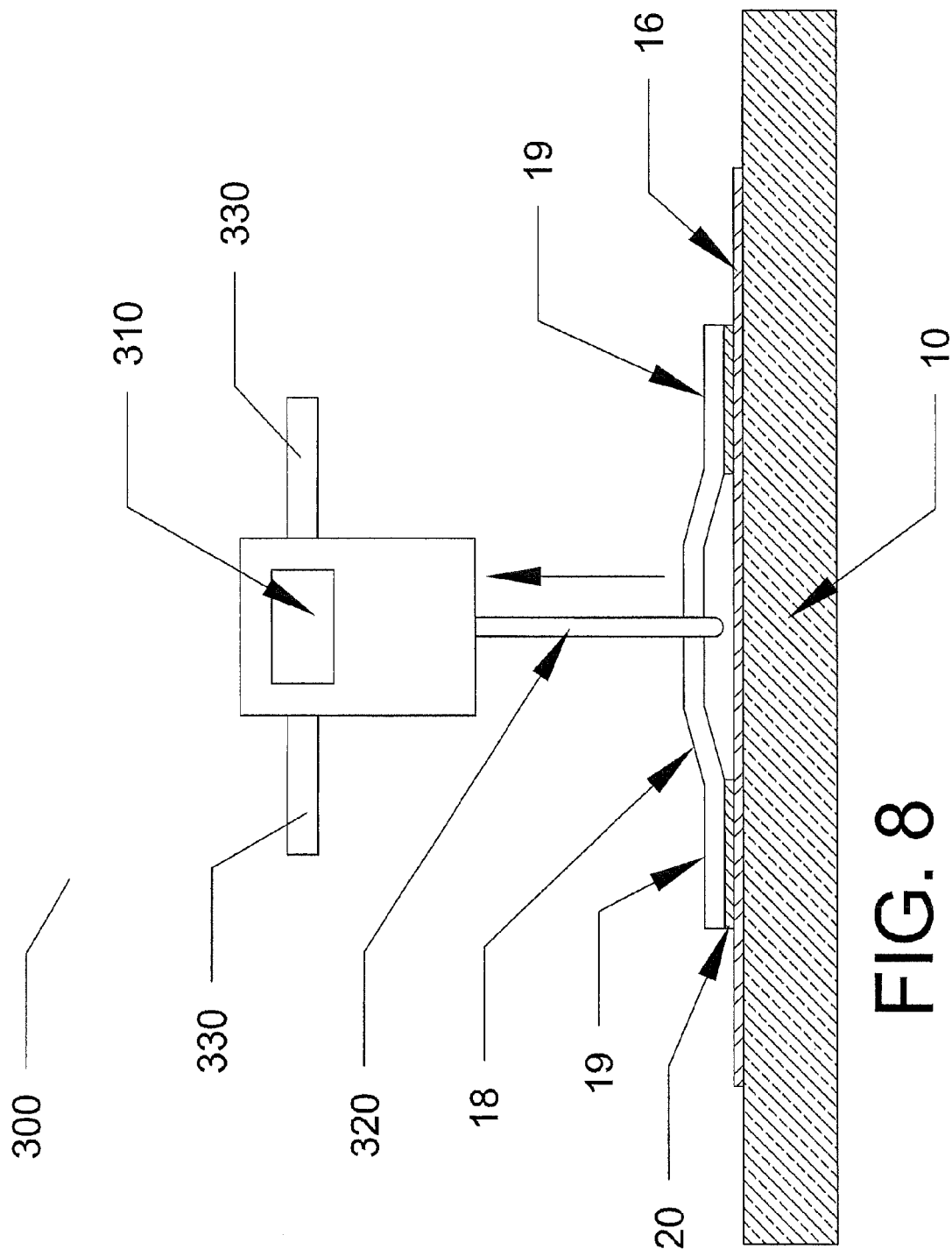
FIG. 8 is a schematic illustration of a pull test employing a force gauge to test the performance of solder compositions of the invention.

In this test, illustrated in FIG. 7, the temperature of a climate controlled chamber (e.g., Russells, Holland Mich., Model RDV-42-25-25/11900955 at a relatively dry humidity, but not controlled) was cycled during a total time of 8 hours from ambient (about 20° C.) to –40° C. and held at –40° C. for 90 minutes, followed by a ramp up to 105° C. for 120 minutes, before returning to ambient temperature, with electrical current loading of 14 V applied through power line 22 starting from the end of the –40° C. step and ending at the end of the 105° C. step, as indicated by the respective arrows shown in FIG. 7. After 20 cycles, each power connector 18 was pulled for 3 seconds in pull test 300 (at ambient temperature), as shown in FIG. 8, in a direction generally normal to the solder layer 20 and windshield surface 10, to a force of 50 N on a digital force gauge 310 (Mark-10 Long Island, N.Y., Model BG100) connected by a hook 320 to power connector 18 approximately at the midpoint in between solder pads 19, and manually operated by handles 330. No failures (i.e., connector disconnects) occurred during this test.

II. Heat Soak Test

This test was performed according to DIN EN ISO 16750-4-K section 5.1.2.2 on nine windshield samples, that included 5 power connectors soldered with the same solder composition used in Test I. Two windshield samples used a solder composition that consisted essentially of about 14.14% by weight tin, about 0.76% by weight antimony, about 0.64% by weight copper, about 2.24% by weight nickel, about 0.75% by weight zinc, about 76.07% by weight indium, and about 5.81% by weight silver. The melting point or temperature (liquidus) of this solder composition was about 137.58° C. and the solidus was about 125.92° C. Two other windshield samples used a solder composition that consisted essentially of about 13.43% by weight tin, about 1.31% by weight antimony, about 0.94% by weight copper, about 2.65% by weight nickel, about 0.49% by weight zinc, about 72.97% by weight indium, and about 7.54% by weight silver. The melting point or temperature (liquidus) of this solder composition was about 140.64° C. and the solidus was about 129.24° C.

Figure 9:
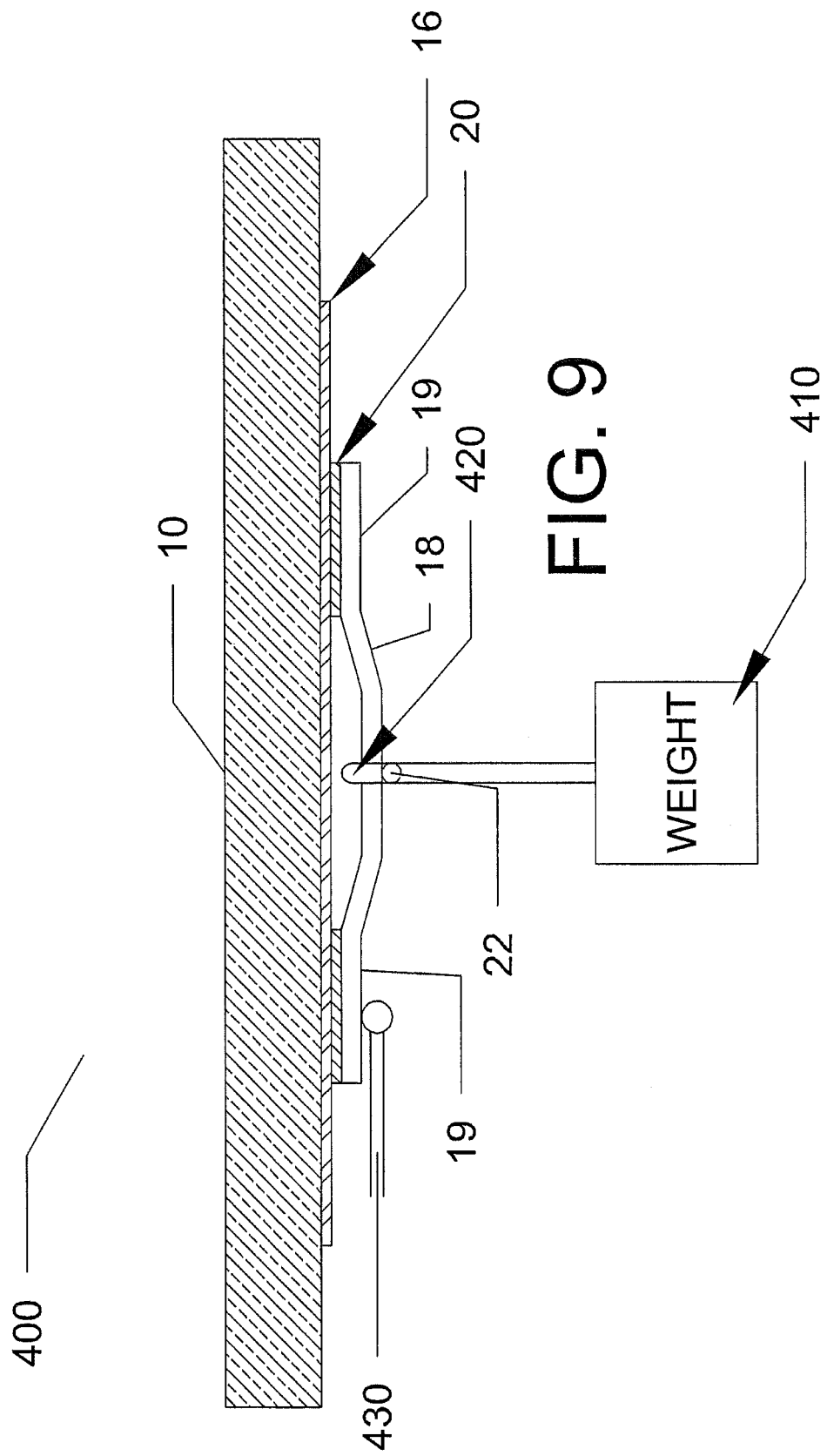
FIG. 9 is a schematic illustration of a pull test employing a weight to test the performance of solder compositions of the invention.

In this test 400, illustrated in FIG. 9, the temperature of a climate controlled chamber (A&W Blake Hot Chamber) was held at 105° C. for 96 hours, with electrical current loading of 14 V applied through power line 22 and mechanical loading of 6 N in a direction generally normal to the solder layer 20 and windshield surface 10 (applied by connecting weight 410 to power connector 18 by hook 420 located approximately at the midpoint in between solder pads 19) directed vertically down as acceleration of gravity during the entire 96 hours. The temperature of the power connectors (measured by thermocouple 430) increased to a maximum of about 120° C. during the test due to the applied electrical load. After the 96 hours test, each power connector was pulled (at ambient temperature) as shown in FIG. 8 and described above, to a force of 50 N on a digital force gauge for 3 seconds (Mark-10 Long Island, N.Y., Model BG50). No failures (i.e., connector disconnects, or microcracks) occurred during this test.

III. High Temperature Storage Test

This test was performed on the same test samples as were used above for Test I. In this test, the temperature of a climate controlled chamber (at a relatively dry humidity, but not controlled) was maintained at a constant 120° C. for 24 hours with no electrical or mechanical loading of the power connectors. After the end of the 24 hours, each power connector was pulled (at ambient temperature) as shown in FIG. 8 and described above, to a force of 50 N on a digital force gauge for 3 seconds (Mark-10 Long Island, N.Y., Model BG100). No failures (i.e., connector disconnects) occurred during this test.

IV. Long Term Test with Electrical Load

This test was performed on the same test samples as were used above for Tests I and III. In this test, the temperature of a climate controlled chamber (humidity relatively dry but not controlled) was maintained at a constant 105° C. for 500 hours with electrical current loading of 14 V during the entire 500 hours. After the end of the 500 hours, each power connector was pulled (at ambient temperature) as shown in FIG. 8 and described above, to a force of 50 N on a digital force gauge for 3 seconds (Mark-10 Long Island, N.Y., Model BG100). No failures (i.e., connector disconnects) occurred during this test.

V. Heat Shock Test

This test was performed according to DIN EN ISO 16750-4-H section 5.4.2. The test samples were five 12"×12" tempered glass plates with 30 power connectors each. The plates were 4 mm thick, tinted, printed with enamel, and overprinted with six silver strips 1" wide. The power connectors were soldered to the silver strips. The power connectors on two plates were soldered with a solder composition consisting essentially of about 14.05% by weight tin, about 0.98% by weight antimony, about 0.87% by weight copper, about 0.70% by weight nickel, about 0.63% by weight zinc, about 74.74% by weight indium, and about 7.98% by weight silver. The melting point or temperature (liquidus) of this solder composition was about 133.18° C. and the solidus was about 123.94° C. The power connectors on one other plate were soldered with a solder composition consisting essentially of about 14.14% by weight tin, about 0.76% by weight antimony, about 0.64% by weight copper, about 2.24% by weight nickel, about 0.75% by weight zinc, about 76.07% by weight indium, and about 5.81% by weight silver. The melting point or temperature (liquidus) of this solder composition was about 137.58° C. and the solidus was about 125.92° C. The power connectors on one additional plate were soldered with a solder composition consisting essentially of about 13.43% by weight tin, about 1.31% by weight antimony, about 0.94% by weight copper, about 2.65% by weight nickel, about 0.49% by weight zinc, about 72.97% by weight indium, and about 7.54% by weight silver. The melting point or temperature (liquidus) of this solder composition was about 140.64° C. and the solidus was about 129.24° C.

In this test, a cycle consisted of heating the samples in a climate controlled chamber to 105° C. for one hour with no electrical or mechanical loading, followed by submerging the samples completely in cold water (about 23° C. or lower, from refrigerator). The samples were dried with compressed air after each cycle. After 5 cycles and then after 10 cycles, each power connector was pulled (at ambient temperature) as shown in FIG. 8 and described above, to a force of 50 N on a digital force gauge for 3 seconds (Mark-10 Long Island, N.Y., Model BG100). No failures (i.e., connector disconnects) occurred during this test.

VI. High Humidity Test: Constant Climate

In this test, performed according to DIN EN ISO 6270-2-CH, eight windshield samples were exposed in an environmental chamber to a constant temperature of 80° C. and a humidity of >96% RH (steam generated) for a total of 504 hours, with electrical current loading on the power connectors of 14 V (drawing about 22 A) for 15 minutes starting at 10 hours after reaching the specified temperature and humidity, and for 15 minutes every 24 hours thereafter until the end of the 504 hours. The temperature of the power connectors (measured by thermocouples) increased to a maximum of about 95° C. during the test due to the applied electrical load. After the end of the 504 hours, each power connector was pulled (at ambient temperature) as shown in FIG. 8 and described above, to a force of 50 N on a digital force gauge for 3 seconds (Mark-10 Long Island, N.Y., Model BG100). If the silver layer (electrical contact surface 16) separated from the glass 10, either during the 504 hours or during the pull test, then pull-tests and electrical tests could not be performed, and the solder contact was assessed as good. However, one windshield sample of each of the three solder compositions described above in Test V completed the high humidity/constant climate test with no failures (i.e., connector disconnects).

VII. Resistance to Screen Washer Fluids

The test sample was a 12"×12" glass plate with 30 power connectors each (as described above), soldered with a solder composition that consisted essentially of about 14.05% by weight tin, about 0.98% by weight antimony, about 0.87% by weight copper, about 0.70% by weight nickel, about 0.63% by weight zinc, about 74.74% by weight indium, and about 7.98% by weight silver. The melting point or temperature (liquidus) of this solder composition was about 133.18° C. and the solidus was about 123.94° C.

In this test, the test sample was submerged for 24 hours in a simulated windshield washer solution made from 11 and ⅛ cups water, 3 and ⅙ cups of ethanol, 1.6 cups of isopropanol, 1 and ¼ tablespoons of ethylene glycol, and a quarter tablespoon of sodium lauryl sulphate. After the end of the 24 hours, each power connector was pulled (at ambient temperature) as shown in FIG. 8 and described above, except that the force gauge 310 was an Instron force gauge operated at a rate of 100 mm/min to a force of 50 N on a force gauge for 2 seconds (Instron, Norwood, Mass. Model 5544). No failures (i.e., connector disconnects) occurred during this test.

VII. Salt Spray Test

This test was performed according to DIN EN ISO 9227 section 8. The test sample was a 12"×12" glass plate with 30 power connectors each (as described above), soldered with a solder composition that consisted essentially of about 14.05% by weight tin, about 0.98% by weight antimony, about 0.87% by weight copper, about 0.70% by weight nickel, about 0.63% by weight zinc, about 74.74% by weight indium, and about 7.98% by weight silver. The melting point or temperature (liquidus) of this solder composition was about 133.18° C. and the solidus was about 123.94° C.

In this test, the test sample was exposed to a salt spray fog in a test chamber (Harshaw Model 22) for 96 hours. The salt concentration was at 5% and the pH was between 6.5 and 7.2. The salt fog temperature was set at +35° C.±2° C., and the tower temperature was set at +48° C., with the air pressure being between 16 and 18 psi. After the end of the 96 hours, each power connector was pulled (at ambient temperature) as shown in FIG. 8 and described above, except that the force gauge 310 was an Instron force gauge operated at a rate of 100 mm/min to a force of 50 N for 2 seconds (Instron, Norwood, Mass. Model 5544). No failures (i.e., connector disconnects) occurred during this test.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A solder composition having a mixture of elements consisting of:
   about 4% to about 25% by weight tin;
   about 0.1% to about 8% by weight antimony;
   about 0.03% to about 4% by weight copper;
   about 0.03% to about 4% by weight nickel;
   about 66% to about 90% by weight indium;
   about 0.5% to about 9% by weight silver; and
   about 0.2% to about 6% by weight zinc.

2. The solder composition of claim 1, wherein the solder composition has a solidus temperature in a range of between about 120° C. and about 145° C.

3. The solder composition of claim 1, wherein the solder composition has a liquidus temperature in a range of between 130° C. and about 155° C.

4. The solder composition of claim 1, wherein the mixture of elements consists of:
   about 7% to about 19% by weight tin;
   about 0.2% to about 8% by weight antimony;
   about 0.1% to about 1.5% by weight copper;
   about 0.1% to about 4% by weight nickel;
   about 70% to about 80% by weight indium;
   about 4% to about 8% by weight silver; and
   about 0.2% to about 6% by weight zinc.

5. The solder composition of claim 1, wherein the mixture of elements consists of:
   about 4% to about 20% by weight tin;
   about 0.1% to about 8% by weight antimony;
   about 0.1% to about 4% by weight copper;
   about 0.1% to about 3% by weight nickel;

about 71% to about 86% by weight indium;
about 1% to about 6% by weight silver; and
about 0.2% to about 6% by weight zinc.

6. A solder composition having a mixture of elements consisting of:
about 11% to about 17% by weight tin;
about 0.5% to about 3% by weight antimony;
about 0.5% to about 1.5% by weight copper;
about 0.5% to about 5% by weight nickel;
about 72% to about 77% by weight indium;
about 4% to about 8.5% by weight silver; and
about 0.3% to about 1.5% by weight zinc.

7. The solder composition of claim 6, wherein the solder composition has a solidus temperature in a range of between about 120° C. and about 145° C.

8. The solder composition of claim 7, wherein the solder composition has a solidus temperature in a range of between about 120° C. and about 135° C.

9. The solder composition of claim 6, wherein the solder composition has a liquidus temperature in a range of between 130° C. and about 155° C.

10. The solder composition of claim 8, wherein the solder composition has a liquidus temperature in a range of between 130° C. and about 145° C.

11. The solder composition of claim 6, wherein the mixture of elements consists of:
about 13% to about 15% by weight tin;
about 0.5% to about 2.5% by weight antimony;
about 0.5% to about 1.5% by weight copper;
about 1% to about 4% by weight nickel;
about 74% to about 75% by weight indium;
about 5% to about 8.5% by weight silver; and
about 0.3% to about 1.5% by weight zinc.

12. The solder composition of claim 11, wherein the mixture of elements consists of:
about 15% by weight tin;
about 0.5% to about 1.5% by weight antimony;
about 0.5% to about 1.5% by weight copper;
about 1% by weight nickel;
about 75% by weight indium;
about 6% by weight silver; and
about 0.5% to about 1.5% by weight zinc.

13. The solder composition of claim 12, wherein the mixture of elements consists of:
about 15% by weight tin;
about 1% by weight antimony;
about 1% by weight copper;
about 1% by weight nickel;
about 75% by weight indium;
about 6% by weight silver; and
about 1% by weight zinc.

14. The solder composition of claim 11, wherein the mixture of elements consists of:
about 14% by weight tin;
about 0.5% to about 1.5% by weight antimony;
about 0.5% to about 1.5% by weight copper;
about 3% by weight nickel;
about 75% by weight indium;
about 5% by weight silver; and
about 0.5% to about 1.5% by weight zinc.

15. The solder composition of claim 14, wherein the mixture of elements consists of:
about 14% by weight tin;
about 1% by weight antimony;
about 1% by weight copper;
about 3% by weight nickel;
about 75% by weight indium;
about 5% by weight silver; and
about 1% by weight zinc.

16. The solder composition of claim 11, wherein the mixture of elements consists of:
about 13% by weight tin;
about 1.5% to about 2.5% by weight antimony;
about 0.5% to about 1.5% by weight copper;
about 4% by weight nickel;
about 74% by weight indium;
about 5% by weight silver; and
about 0.5% to about 1.5% by weight zinc.

17. The solder composition of claim 16, wherein the mixture of elements consists of:
about 13% by weight tin;
about 2% by weight antimony;
about 1% by weight copper;
about 4% by weight nickel;
about 74% by weight indium;
about 5% by weight silver; and
about 1% by weight zinc.

18. A solder composition having a mixture of elements consisting of:
about 4% to about 25% by weight tin;
about 0.1% to about 8% by weight antimony;
about 0.03% to about 4% by weight copper;
about 0.03% to about 4% by weight nickel;
about 66% to about 90% by weight indium;
about 0.5% to about 9% by weight silver;
about 0.2% to about 6% by weight zinc; and
about 0.01% to about 0.3% by weight germanium.

* * * * *

UNITED STATES PATENT AND TRADEMARK OFFICE
CERTIFICATE OF CORRECTION

| | |
|---|---|
| PATENT NO. | : 8,771,592 B2 |
| APPLICATION NO. | : 13/363618 |
| DATED | : July 8, 2014 |
| INVENTOR(S) | : Jennie S. Hwang et al. |

It is certified that error appears in the above-identified patent and that said Letters Patent is hereby corrected as shown below:

In the Claims:

Claim 10, Column 21, Line 22, delete "8" and insert --9--

Signed and Sealed this
Twenty-fifth Day of November, 2014

Michelle K. Lee
*Deputy Director of the United States Patent and Trademark Office*